(12) United States Patent
Chen et al.

(10) Patent No.: US 8,970,033 B2
(45) Date of Patent: Mar. 3, 2015

(54) EXTENDING METAL TRACES IN BUMP-ON-TRACE STRUCTURES

(75) Inventors: Yu-Feng Chen, Hsin-Chu (TW); Yuh Chern Shieh, Taipei (TW); Tsung-Shu Lin, Yonghe (TW); Han-Ping Pu, Taichung (TW); Jiun Yi Wu, Zhongli (TW); Tin-Hao Kuo, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 707 days.

(21) Appl. No.: 13/035,586

(22) Filed: Feb. 25, 2011

(65) Prior Publication Data

US 2012/0217632 A1    Aug. 30, 2012

(51) Int. Cl.
  *H01L 23/498* (2006.01)
  *H01L 23/00* (2006.01)

(52) U.S. Cl.
  CPC .......... *H01L 24/16* (2013.01); *H01L 24/13* (2013.01); *H01L 24/17* (2013.01); *H01L 23/49838* (2013.01); *H01L 2224/16225* (2013.01); *H01L 2924/01082* (2013.01); *H01L 2924/01019* (2013.01); *H01L 2224/13147* (2013.01); *H01L 2224/131* (2013.01); *H01L 2224/16227* (2013.01); *H01L 2924/01013* (2013.01); *H01L 2224/16013* (2013.01); *H01L 2924/01074* (2013.01); *H01L 2924/01322* (2013.01); *H01L 2924/00013* (2013.01); *H01L 23/49816* (2013.01); *H01L 2924/01079* (2013.01); *H01L 2924/01033* (2013.01); *H01L 2924/014* (2013.01); *H01L 2224/13082* (2013.01); *H01L 2924/01029* (2013.01)

USPC .................. 257/737; 257/E23.068; 257/762; 257/784; 257/E23.01; 257/E23.024

(58) Field of Classification Search
  USPC ............ 257/737, E23.068, 762, 784, E23.01, 257/E23.06, E23.024
  See application file for complete search history.

(56) References Cited

U.S. PATENT DOCUMENTS

| | | | | |
|---|---|---|---|---|
| 5,591,984 | A * | 1/1997 | Drucker | 250/551 |
| 7,812,460 | B2 * | 10/2010 | Hsu | 257/778 |
| 2009/0072385 | A1 * | 3/2009 | Alley et al. | 257/713 |
| 2010/0007017 | A1 * | 1/2010 | Wei et al. | 257/737 |
| 2010/0133687 | A1 * | 6/2010 | Lin et al. | 257/737 |

OTHER PUBLICATIONS

Pendse, R.D., et al., "Bond-on-Lead: A Novel Flip Chip Interconnection Technology for Fine Effective Pitch and High I/O Density," 2006 Electronic Components and Technology Conference, IEEE, pp. 16-23.

Pendse, R., et al., "Low Cost Flip Chip (LCFC): An Innovative Approach for Breakthrough Reduction in Flip Chip Package Cost," 2010 Electronic Components and Technology Conference, IEEE, pp. 1-9.

* cited by examiner

*Primary Examiner* — S. V. Clark
*Assistant Examiner* — Krista Soderholm
(74) *Attorney, Agent, or Firm* — Slater & Matsil, L.L.P.

(57) ABSTRACT

A device includes a work piece, and a metal trace on a surface of the work piece. A Bump-on-Trace (BOT) is formed at the surface of the work piece. The BOT structure includes a metal bump, and a solder bump bonding the metal bump to a portion of the metal trace. The metal trace includes a metal trace extension not covered by the solder bump.

17 Claims, 7 Drawing Sheets

EXTENDING METAL TRACES IN BUMP-ON-TRACE STRUCTURES

BACKGROUND

Bump-on-Trace (BOT) structures were used in flip chip packages, wherein metal bumps are bonded onto narrow metal traces in package substrates directly, rather than bonded onto metal pads that have greater widths than the respective connecting metal traces. The BOT structures require smaller chip areas, and the manufacturing cost of the BOT structures is low. The conventional BOT structures may achieve the same reliability as the conventional bond structures based on metal pads.

The BOT structures used to include a solder mask layer that is formed on the metal traces. The solder mask layer covers portions of the metal traces, and leaves some openings, through which the metal traces are exposed. During the bonding process, solder bumps extend into the openings, and are bonded to the exposed portions of the metal traces. The solder mask layer provides mechanical support for the BOT structures, and the metal traces are unlikely to peel off from the underlying structures.

With the evolving of bump structures, the solder mask layer may be omitted. Since the package substrates may be bonded to device dies that include extreme low-k dielectric layers therein, not forming the solder mask layer is beneficial for reducing the risk of the peeling occurring in the extreme low-k dielectric layers. However, without a solder mask layer to cover the metal traces, the risk of the peeling between the metal traces and the underlying structures in the package substrates increases.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A package structure comprising a Bump-on-Trace (BOT) structure is provided in accordance with an embodiment. The variations of the embodiment are discussed. Throughout the various views and illustrative embodiments, like reference numbers are used to designate like elements.

Figure 1:
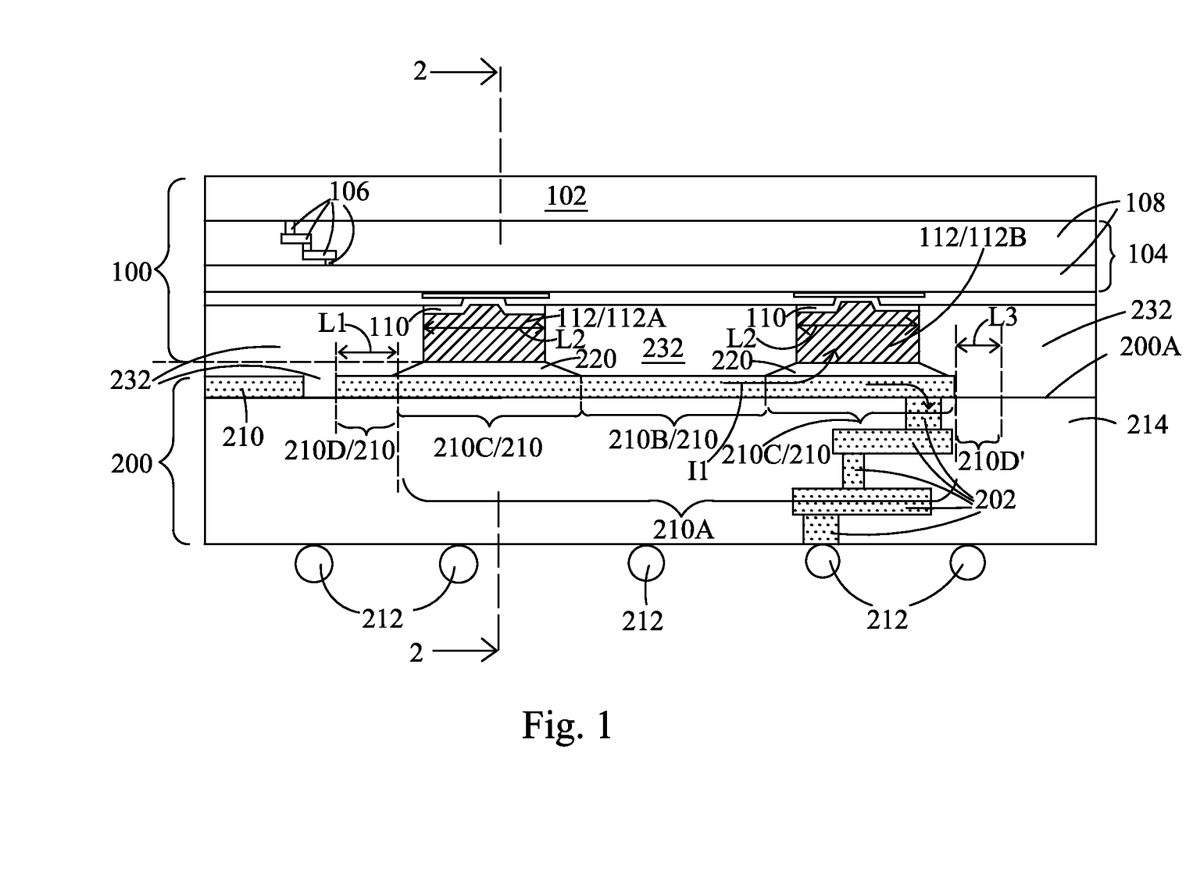
FIGS. 1 and 2 are cross-sectional views of a package structure comprising a bump-on-Trace (BOT) structure, wherein a metal trace extension is formed at an end of a BOT structure.

FIG. 1 illustrates a cross-sectional view of the package structure in accordance with an embodiment. The package structure includes work piece 100 bonded to work piece 200. Work piece 100 may be a device die that includes active devices such as transistors (not shown) therein, although work piece 100 may also be an interposer that does not have active devices therein. In an embodiment wherein work piece 100 is a device die, substrate 102 may be a semiconductor substrate such as a silicon substrate, although it may include other semiconductor materials. Interconnect structure 104, which includes metal lines and vias 106 formed therein and connected to the semiconductor devices, is formed on substrate 102. Metal lines and vias 106 may be formed of copper or copper alloys, and may be formed using damascene processes. Interconnect structure 104 may include a commonly known inter-layer dielectric (ILD, not shown) and inter-metal dielectrics (IMDs) 108. IMDs 108 may comprise low-k dielectric materials, and may have dielectric constants (k values) lower than about 3.0. The low-k dielectric materials may also be extreme low-k dielectric materials having k values lower than about 2.5. Work piece 100 may further include under-bump metallurgies (UBMs) 110 and copper posts 112 on UBMs 110. Throughout the description, copper posts 112 are also referred to as copper-containing bumps or metal bumps.

Work piece 200 may be a package substrate, although it may be other package components such as interposers, for example. Work piece 200 may include metal lines and vias 202 connecting metal features on opposite sides of work piece 200. In an embodiment, metal trace(s) 210 on the topside of work piece 200 are electrically connected to ball grid array (BGA) balls 212 on the bottom side of work pieces 200 through metal lines and vias 202. Metal lines and vias 202 may be formed in dielectric layers 214, although they may also be formed in a semiconductor layer (such as a silicon layer, not shown) and in the dielectric layers that are formed on the semiconductor layer.

Metal trace 210 is formed over a top dielectric layer in dielectric layers 214. Metal traces 210 may be formed of substantially pure copper, aluminum copper, or other metallic materials such as tungsten, nickel, palladium, gold, and/or alloys thereof.

Figure 2:
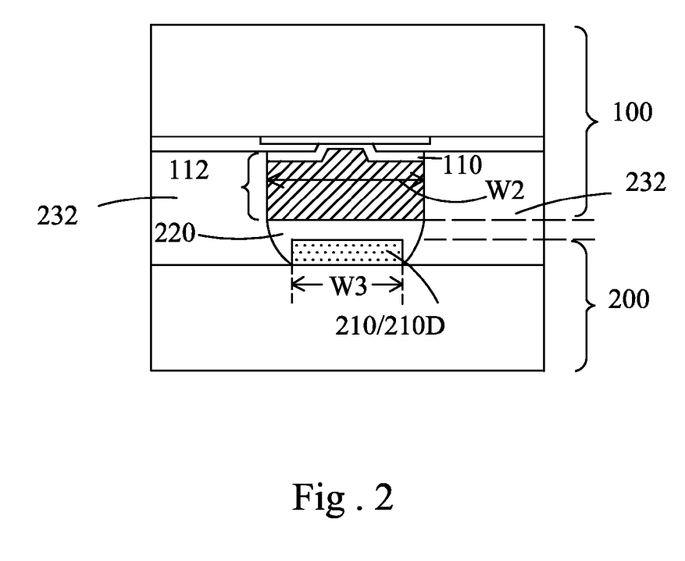

Work pieces 100 and 200 are bonded to each other through solder bumps 220, which may be formed of a lead-free solder, a eutectic solder, or the like. Solder bumps 220 are bonded to, and contact, the top surfaces of metal traces 210, wherein the top surfaces face work piece 100. FIG. 2 illustrates a cross-sectional view of the package structure shown in FIG. 1, wherein the cross-sectional view is obtained from the plane crossing line 2-2 in FIG. 1. As shown in FIG. 2, solder bumps 220 may also contact the sidewalls of metal traces 210. After the bonding of work pieces 100 and 200, mold underfill (MUF) 232 may be filled into the space between work pieces 100 and 200. Accordingly, MUF 232 is also filled into the space between neighboring metal traces 210, and may contact the ends and sidewalls of metal traces 210. Alternatively, no MUF is filled, while air fills the space between work pieces 100 and 200, and fills the space between neighboring metal traces 210.

Referring again to FIG. 1, metal traces 210 may be used to electrically interconnect metal bumps 112A and 112B. Accordingly, when the package structure as shown in FIG. 1 is in operation and powered on, current I1 may flow through portion 210A of metal trace 210 and flow between metal bumps 112A and 112B. Throughout the description, portion 210A represents the portion of metal trace 210 that is configured to have currents flowing through. Alternatively, metal trace 210 may connect metal bumps 112 to metal lines and vias 202. Accordingly, currents (such as current I2) may also flow through portion 210A of metal trace 210. Portion 210A may include portions 210C that are covered by, and contacting, solder bumps 220. Furthermore, portion 210A may include portion 210B that interconnects portions 210C.

Metal trace 210 may include portion 210D that is not connected to any other copper bumps or metal features besides portion 210C, and there is no current flowing through portion 210D when the package structure is powered on. Each metal trace extension 210D may have a first end contacting a respective portion 210C, and a second end not connected to any metal feature. The second end may contact MUF 232. Throughout the description, the portions (such as 210D) of metal traces 210, which portions are configured not to have currents flowing through during the operation of the package structure, are referred to as metal trace extensions.

Portion 210D and the respective metal bump 120 have lengths L1 and L2, respectively, wherein lengths L1 and L2 are measured in the lengthwise direction of the respective metal trace 210. In an embodiment, ratio L1/L2 is greater than about 0.05, greater than about 0.10, or greater than about 0.25. Length L1 may also be greater than about 10 μm, greater than about 20 μm, or greater than about 30 μm. On the other hand, in an embodiment, metal trace extensions may not be formed at some of the ends of metal traces 210. For example, In FIG. 1, no metal trace extension is formed at the position illustrated using dashed lines marked as 210D'. In other embodiments, metal trace extension 210D' are formed, as illustrated with the dashed lines. Length L3 of metal trace extension 210D', however, may be much smaller than length L1 of metal trace extension 210D. In an exemplary embodiment, ratio L3/L1 may be smaller than 0.5, smaller than 0.2, or smaller than 0.1, if metal trace extension 210D' is ever formed.

Figure 3:
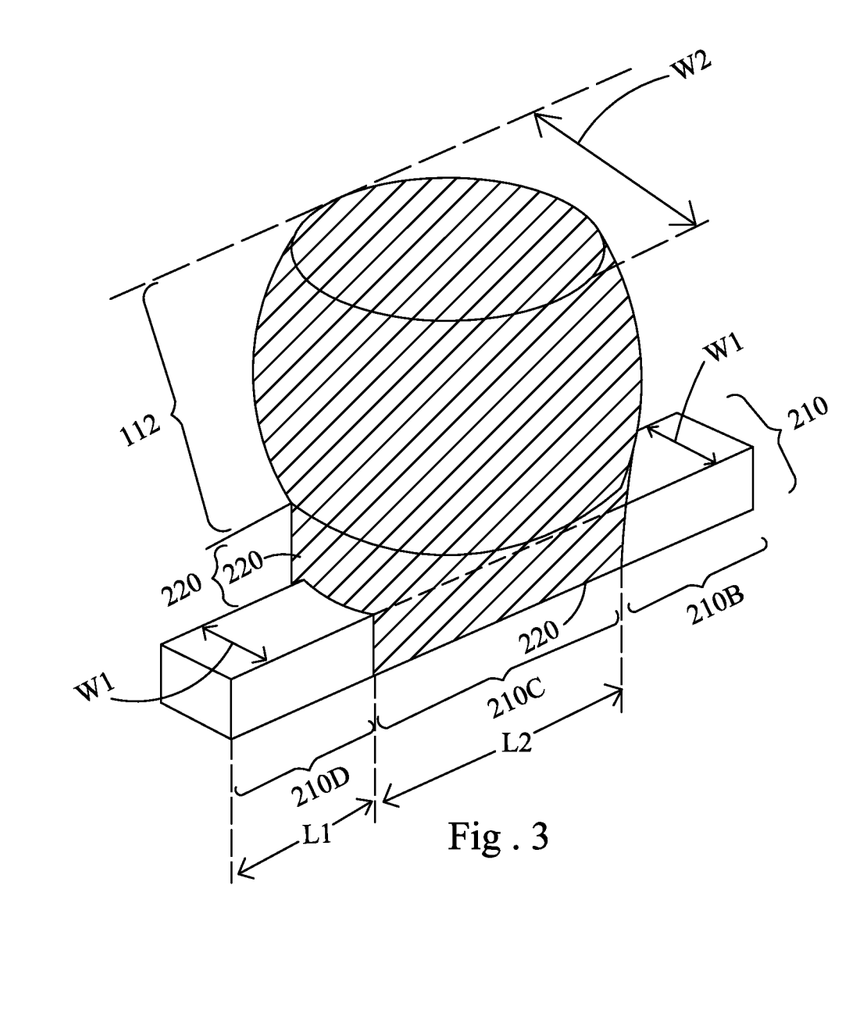
FIG. 3 illustrates a perspective view of the BOT structure as in FIGS. 1 and 2.

FIG. 3 illustrates an exemplary perspective view of metal trace 210, the overlying metal bump 112, and solder bump 220. In an embodiment, metal trace portions 210A, 210B, 210C, and 210D have a substantially uniform width, which is illustrated as width W1 in FIG. 3 and width W3 in FIG. 2, wherein width W1 is the width of portion 210D and portion 210B, while width W3 is the width of portion 210C. In alternative embodiment, width W3 (FIG. 2) of portion 210C is slightly greater than the width W1 of portion 210D (FIG. 3), with ratio W3/W1 being greater than 1.0, for example. Ratio W3/W2, on the other hand, may be smaller than 1.0. Accordingly, the structure as shown in FIG. 3 is referred to as being a BOT structure since solder bump 220 is formed directly on the top surface and sidewalls of metal trace 210, and not on a metal pad that has a width significantly greater than width W1 of metal trace 210.

In some embodiments, in the direction toward the respective center 230 (not shown in FIG. 1, please refer to FIGS. 4 and 5) of work piece 200, metal trace extensions 210D are formed. In the direction away from center 230, however, no metal trace extension is formed. Referring to FIG. 1, the left direction is toward center 230, and the right direction is away from center 230. Accordingly, metal trace extension 210D is formed on the left side of metal trace 210, while no metal trace extension is formed on the right side of metal trace 210 and at the position marked as 210D'.

Figure 4:
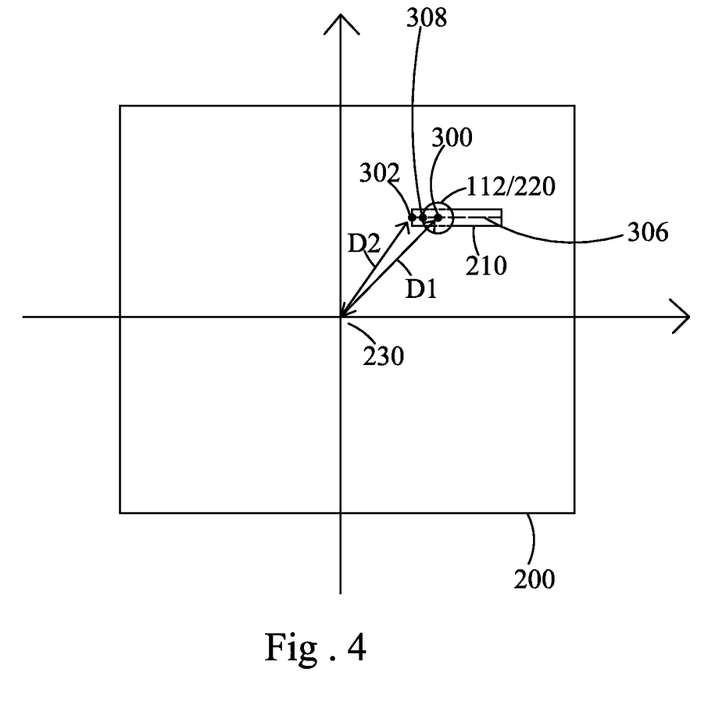
FIGS. 4 and 5 illustrate the determination of the extending directions of metal trace extensions.
Figure 5:
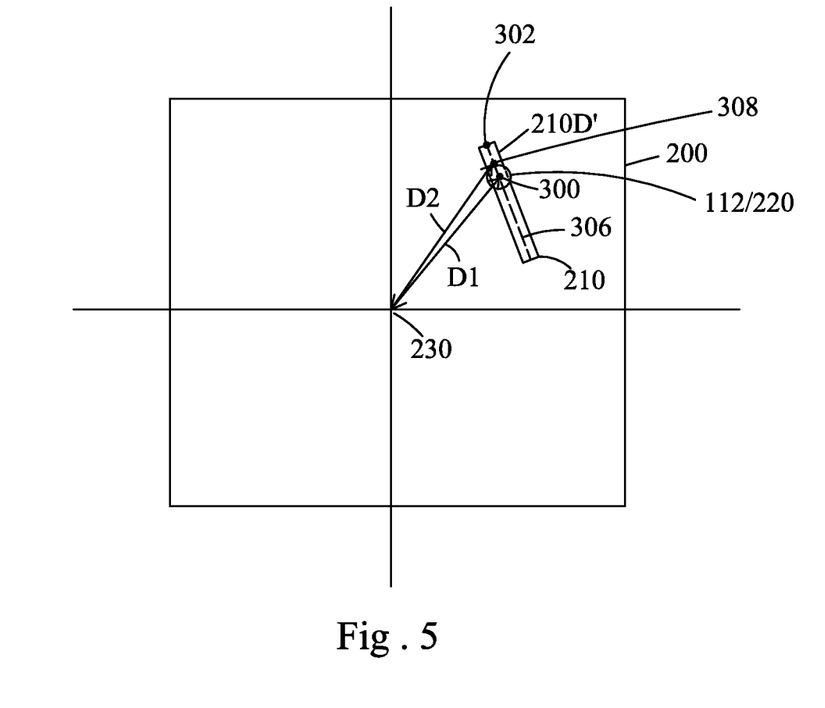

FIGS. 4 and 5 illustrate examples for explaining how to determine whether an end of metal trace 210 is toward or away from center 230 of the respective work piece 200. FIGS. 4 and 5 are schematic top views of work piece 200, wherein center 230 of work piece 200 is marked. The centers of metal bumps 112 are marked as points 300. Points 302 are the end points of the likely metal trace extensions 210D (or metal trace extensions 210D', if formed), wherein points 302 may be on the middle lines 306 of the respective metal traces 210. The distances between points 300 and the respective centers 230 are marked as D1, and the distances between points 302 and the respective centers 230 are marked as D2.

In FIG. 4, distance D2 is smaller than distance D1. Alternatively stating, if an object moves from center point 300 of metal bump 112 to the end point 302 of metal trace extension 210D, the distance between the object and center 230 decreases, and the object actually moves toward center 230. Accordingly, the direction from point 300 to point 302 is referred to as being "toward" center 230, and the respective metal trace extension 210D is referred to as being extending toward center 230. In the embodiments, metal trace extensions 210D are formed if they extend in the direction toward center 230. It is observed that if metal trace extension 210D in FIG. 4 is not formed, metal trace 210 will still have end 308, which end is also the edge of the respective solder bump 220. End 308 is referred to as being facing toward center 230. Furthermore, in some embodiments, throughout work piece 200, substantially all metal traces 210 that have ends 308 facing toward center 230 have a respective metal trace extensions 210D formed.

Conversely, as shown in FIG. 5, distance D2 is greater than distance D1. Alternatively stating, if an object moves from center point 300 to end point 302 of the metal trace extension 210D' (if it is formed), the distance between the object and center 230 increases, and the object actually moves away from center 230. Accordingly, the direction from point 300 to point 302 is referred to as being "away from" center 230, and the respective metal trace extension 210D' (if it is formed) is referred to as being extending away from center 230. End 308 of metal trace 210 is also referred to as facing away from center 230. In an embodiment, no metal trace extension will be formed at the position marked using dashed lines. In some embodiments, throughout work piece 200, substantially no metal trace extensions 210D' are formed at ends of traces 210, which ends extend in the directions away from center 230.

Figure 6:
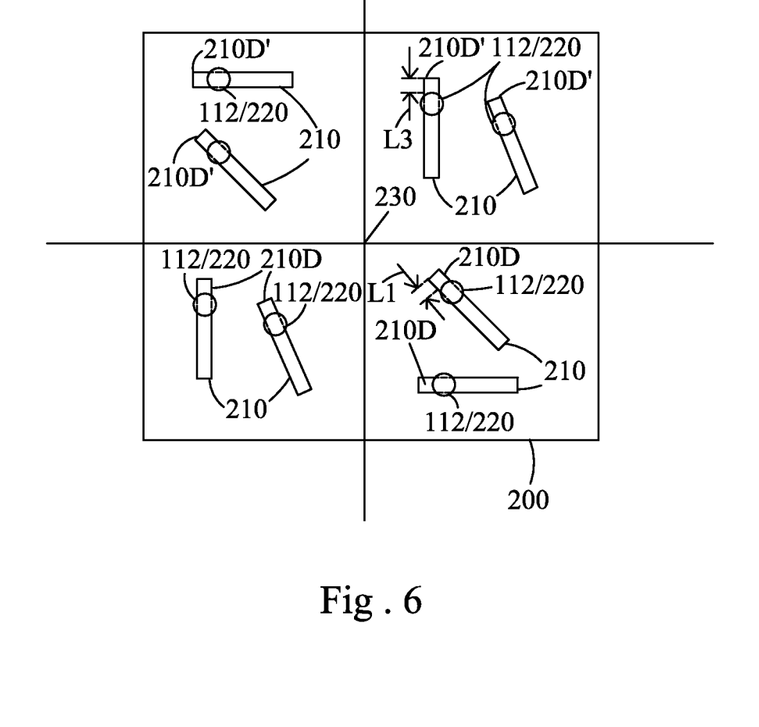
FIG. 6 illustrates various metal traces, with some of metal traces comprising metal trace extensions, and some other metal traces not comprising metal trace extensions.

FIG. 6 illustrates some exemplary metal traces 210 and the respective metal bumps 112 and solder bumps 220. The solid line marked as 210D are where metal trace extensions 210D are to be formed, while the dashed lines marked as 210D' are where metal trace extensions will not be formed, or even formed, the respective lengths L3 are much smaller than the lengths L1 of metal traces 210D.

Figure 7:
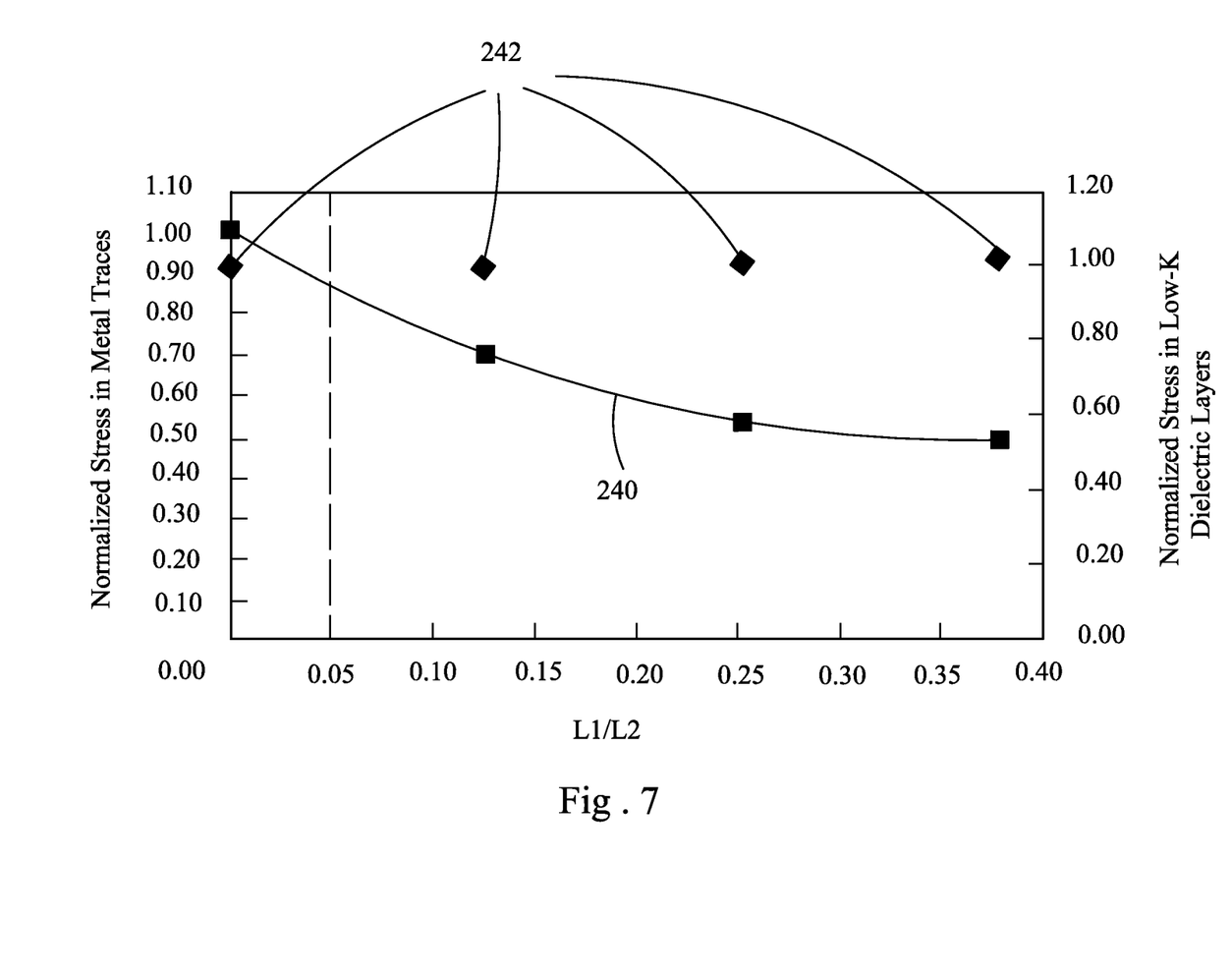
FIG. 7 illustrates normalized stresses occurring to the metal traces and low-k dielectric layers in the package structure.

Simulation results have revealed that metal trace extensions toward centers 230 of the respective work pieces 200 are beneficial for reducing the likelihood of peeling, which peeling occurs between metal traces 210 and the respective underlying dielectric layer 214 (FIG. 1). FIG. 7 illustrates the simulation results, wherein normalized stresses (left Y-axis) are illustrated as a function of ratios L1/L2, wherein stresses that are normalized are in the direction perpendicular to surface 200A (FIG. 1) of work piece 200. FIG. 7 illustrates that, as shown as line 240, with the increase in lengths L1 of metal trace extensions 210D, the stresses decrease, resulting in a smaller possibility for the peeling to occur. When ratios L1/L2 are greater than about 0.05, the reduction in the normalized stresses may be greater than about 10 percent.

Furthermore, as shown in FIG. 7, points 242, which correspond to the right Y-axis, illustrate the normalized stresses occurring in low-k dielectric layers 108 of work piece 100 (FIG. 1). Points 242 indicate that with the increase in ratio L1/L2, hence the reduction in the stresses occurring to metal traces 210, the stress in the low-k dielectric layers remain substantially unchanged. Alternatively stating, the reduction in the stresses of metal traces 210 is not at the cost of the increase in the stresses in the low-k dielectric layers.

In accordance with embodiments, a device includes a work piece, and a metal trace on a surface of the work piece. A Bump-on-Trace (BOT) is formed at the surface of the work piece. The BOT structure includes a metal bump, and a solder bump bonding the metal bump to a portion of the metal trace. The metal trace includes a metal trace extension not covered by the solder bump.

In accordance with other embodiments, a device die includes a first and a second metal bump at a surface. A package substrate includes a first and a second metal trace at a surface. A first solder bump bonds the first metal bump to a part of the first metal trace, wherein the first solder bump contacts a surface of the first metal trace facing the device die, and contacts sidewalls of the first metal trace. A metal trace extension is a part of the first metal trace. The metal trace extension is configured not to have current flowing through at a state the device die is powered on, and wherein the metal trace extension joins the part of the first metal trace bonded to the first solder bump. A second solder bump bonds the second metal bump to a part of the second metal trace. The second solder bump contacts a surface of the second metal trace facing the device die, and contacts sidewalls of the second metal trace. No metal trace extension is formed as a part of the second metal trace and configured not to have current flowing through.

In accordance with yet other embodiments, a device includes a first work piece; a second work piece; a copper-containing bump at a surface of the first work piece; a copper-containing trace having a substantially uniform width on a surface of the second work piece; and a solder bump bonding the copper-containing bump to the copper-containing metal trace. The solder bump is bonded to and contacts a first portion of the copper-containing trace. The copper-containing trace further comprises a second portion comprising a first end contacting the first portion, and a second end connected to a metal feature at a level different from a level of the metal trace. Furthermore, the copper-containing trace comprises a third portion, wherein the second and the third portions are on opposite sides of the first portion, and wherein the third portion has a first end contacting the first portion, and a second end not contacting any additional metal feature.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
a first work piece;
a first metal trace on a surface of the work piece; and
a first Bump-on-Trace (BOT) structure comprising:
a first metal bump; and
a first solder bump bonding the first metal bump to a portion of the first metal trace, wherein the first metal trace comprises a metal trace extension not covered by the first solder bump, and a ratio of a length of the metal trace extension to a length of the first metal bump is greater than about 0.05.

2. The device of claim 1, wherein the metal trace extension is configured not to conduct current at a state the device is powered on.

3. The device of claim 1, wherein the metal trace extension extends in a direction toward a center of the first work piece.

4. The device of claim 1 further comprising a second BOT structure comprising:
a second metal trace on the surface of the first work piece;
a second metal bump; and
a second solder bump bonding the second metal bump to the second metal trace, wherein the second solder bump is bonded to a top surface and opposite sidewalls of a portion of the second metal trace, and wherein the second metal trace does not comprise a metal trace extension adjoining the portion of the second metal trace, and wherein the first metal trace and the second metal trace are formed of a same material, and are in a same metal-containing layer.

5. The device of claim 1, wherein the ratio is greater than about 0.2.

6. The device of claim 1, wherein the metal trace extension has substantially a same width as the portion of the first metal trace bonded to the first solder bump.

7. The device of claim 1, wherein for substantially all metal traces in the first work piece, substantially no metal trace extension is formed to extend in directions away from a center of the first work piece.

8. The device of claim 1 further comprising a second work piece bonded to the first work piece through the first metal bump and the first solder bump.

9. The device of claim 8, wherein the first work piece is a package substrate, and the second work pieces is a device die.

10. A device comprising:
a device die comprising a first and a second metal bump at a surface;
a package substrate comprising a first and a second metal trace at a surface;
a first solder bump bonding the first metal bump to a part of the first metal trace, wherein the first solder bump contacts a surface of the first metal trace facing the device die, and contacts sidewalls of the first metal trace;
a metal trace extension as a part of the first metal trace, wherein the metal trace extension is configured not to have current flowing through at a state the device die is powered on, and wherein the metal trace extension joins the part of the first metal trace bonded to the first solder bump wherein a ratio of a length of the metal trace extention to a length of the first metal bump is greater than about 0.05; and
a second solder bump bonding the second metal bump to a part of the second metal trace, wherein the second solder bump contacts a surface of the second metal trace facing the device die, and contacts sidewalls of the second metal trace, and wherein no metal trace extension is formed as a part of the second metal trace and configured not to have current flowing through.

11. The device of claim 10, wherein the metal trace extension extends in a direction toward a center of the package substrate, and wherein an end of the portion of the second metal trace bonded to the second solder bump is in a direction away from the center.

12. The device of claim 10, wherein substantially no metal trace extension is formed at ends of metal traces in the package substrate and extending in directions away from a center of the package substrate.

13. The device of claim 10 further comprising a mold underfill in a space between the device die and the package substrate, wherein the mold underfill extends into a space between neighboring metal traces in the package substrate.

14. A device comprising:
a first work piece;
a second work piece;
a copper-containing bump at a surface of the first work piece;
a copper-containing trace having a substantially uniform width on a surface of the second work piece; and
a solder bump bonding the copper-containing bump to the copper-containing trace, wherein the solder bump is bonded to and contacts a top surface and opposite sidewalls of a first portion of the copper-containing trace, with the opposite sidewalls being on opposite sides of the first portion, and wherein the copper-containing trace comprises:
a second portion comprising a first end contacting the first portion, and a second end connected to a metal feature at a level different from a level of the copper-containing trace; and
a third portion, wherein the second and the third portions are on opposite sides of the first portion, and wherein the third portion comprises a first end contacting the first portion, and a second end not contacting any additional metal feature, and the third portion has a length greater than about 10 µm.

15. The device of claim 14, wherein the second end of the third portion contacts a mold underfill.

16. The device of claim 14, wherein a length of the first portion to a length of the copper-containing bump is greater than about 0.05.

17. The device of claim 14, wherein the second portion is configured not to conduct current at a state the first and the second work pieces are powered on.

\* \* \* \* \*